United States Patent
Park

(10) Patent No.: US 9,285,829 B2
(45) Date of Patent: Mar. 15, 2016

(54) MOBILE TERMINAL

(75) Inventor: Byungduck Park, Gyeonggi-Do (KR)

(73) Assignee: LG ELECTRONICS INC., Seoul (KR)

( * ) Notice: Subject to any disclaimer, the term of this patent is extended or adjusted under 35 U.S.C. 154(b) by 193 days.

(21) Appl. No.: 13/401,587

(22) Filed: Feb. 21, 2012

(65) Prior Publication Data

US 2012/0287060 A1   Nov. 15, 2012

(30) Foreign Application Priority Data

May 11, 2011  (KR) .................. 10-2011-0044170

(51) Int. Cl.
| | |
|---|---|
| G06F 1/16 | (2006.01) |
| H04M 1/23 | (2006.01) |
| G06F 3/02 | (2006.01) |
| H04M 1/02 | (2006.01) |
| H04M 1/22 | (2006.01) |

(52) U.S. Cl.
CPC ............ *G06F 1/1626* (2013.01); *G06F 1/1684* (2013.01); *G06F 3/0202* (2013.01); *H04M 1/23* (2013.01); *H01H 2219/039* (2013.01); *H03K 2217/960785* (2013.01); *H04M 1/0266* (2013.01); *H04M 1/22* (2013.01); *H04M 2250/22* (2013.01)

(58) Field of Classification Search
CPC .............................................. G06F 2203/04103
USPC ........................... 200/310–316; 345/168–170
See application file for complete search history.

(56) References Cited

U.S. PATENT DOCUMENTS

| | | | | |
|---|---|---|---|---|
| 6,232,592 B1 * | 5/2001 | Sugiyama | ................. | 250/227.11 |
| 7,196,693 B2 * | 3/2007 | Chien et al. | ................... | 345/168 |
| 7,223,004 B2 * | 5/2007 | Chen et al. | ..................... | 362/611 |
| 7,417,624 B2 * | 8/2008 | Duff | .............................. | 345/168 |
| 7,543,973 B2 * | 6/2009 | Shimura | ....................... | 362/619 |
| 7,663,071 B2 * | 2/2010 | Chang | ........................... | 200/345 |
| 8,262,272 B2 * | 9/2012 | Cheng et al. | .................. | 362/610 |
| 2004/0196412 A1 | 10/2004 | Cariolato | | |
| 2006/0187552 A1 * | 8/2006 | Huang et al. | .................. | 359/619 |
| 2007/0152965 A1 * | 7/2007 | Krzyzanowski et al. | ...... | 345/156 |
| 2007/0279391 A1 * | 12/2007 | Marttila et al. | ............... | 345/169 |
| 2008/0007964 A1 * | 1/2008 | Lin | ................ | 362/602 |
| 2008/0165542 A1 * | 7/2008 | Kim et al. | ..................... | 362/339 |
| 2009/0067151 A1 * | 3/2009 | Sahlin et al. | .................... | 362/23 |
| 2011/0109533 A1 * | 5/2011 | Suzuki | ........................... | 345/84 |
| 2011/0199322 A1 * | 8/2011 | Langlois et al. | .............. | 345/173 |
| 2011/0279405 A1 * | 11/2011 | Meng | ............................ | 345/174 |

FOREIGN PATENT DOCUMENTS

| | | | |
|---|---|---|---|
| EP | | 2058727 A2 | 5/2009 |
| WO | WO 2007/146634 A2 | | 12/2007 |

OTHER PUBLICATIONS

Walsh, "HTC Wildfire Review: The low-cost version of the HTC Desire arrives," Apr. 1, 2011, 8 pages, XP-002728670.

\* cited by examiner

*Primary Examiner* — William Boddie
*Assistant Examiner* — Bryan Earles
(74) *Attorney, Agent, or Firm* — Birch, Stewart, Kolasch & Birch, LLP

(57) ABSTRACT

A mobile terminal includes a window having a pattern formed to recognize a user's touch input, a key region formed on one surface of the window, and a key body assembly disposed on the other surface of the window to be laminated on the key region, and the key body assembly has one surface equipped with at least one recess member or protrusion member and the other surface equipped with a key body coupled to a light guide film, whereby the mobile terminal can have a distinguished attraction and a quality-enhanced appearance.

8 Claims, 4 Drawing Sheets

MOBILE TERMINAL

CROSS-REFERENCE TO RELATED APPLICATIONS

This application claims priority to Korean Application No. 10-2011-0044170, filed on May 11, 2011, which is herein expressly incorporated by reference in its entirety.

BACKGROUND OF THE INVENTION

1. Field of the Invention

This disclosure relates to an input apparatus for a mobile terminal, and a configuration of a display unit thereof.

2. Description of Related Art

As it becomes multifunctional, a terminal can be allowed to capture still images or moving images, play music or video files, play games, receive broadcast and the like, so as to be implemented as an integrated multimedia player. Such terminals may be divided into mobile/portable terminals and stationary terminals according to their mobility.

The mobile terminals can be easily carried and have one or more of functions such as supporting voice and video telephony calls, inputting and/or outputting information, storing data and the like.

Various new attempts have been made for the terminals by hardware or software in order to implement and enhance such complicated functions. Especially, in regard of manufacturing the mobile terminal, several approaches to make outer faces of cases or key marks of the mobile terminals more attractive may be considered.

BRIEF SUMMARY OF THE INVENTION

Therefore, an aspect of the detailed description is to provide a mobile terminal having an appearance in a different shape from the existing shapes, namely, a mobile terminal having unique patterns on an outer surface of a case thereof.

To achieve these and other advantages and in accordance with the purpose of this specification, as embodied and broadly described herein, a mobile terminal including a window having patterns sensitive to user's touch inputs, a key region formed at one surface of the window, and a key body assembly disposed on the other surface of the window to be laminated on the key region, wherein the key body assembly has one surface equipped with at least one recess member or protrusion member, and the other surface equipped with a key body coupled to a light guide film.

In accordance with one exemplary embodiment, the key body assembly may further include electric diodes laminated on one surface of the light guide film to emit light to at least part of the key region in response to a touch input.

In accordance with one exemplary embodiment, a key mark printed layer having different patterns related to functions of the terminal may be located between the key body and the light guide film.

In accordance with one exemplary embodiment, the window may include a key mark printed layer having different patterns related to functions of the terminal.

In accordance with one exemplary embodiment, the key body may be divided into plurality, and the respective divided key bodies may have different patterns related to functions of the terminal.

In accordance with one exemplary embodiment, the key body may be made of a transparent or semi-transparent material.

In accordance with one exemplary embodiment, the key body and the window may be partially spaced apart from each other by a predetermined gap, and the key body assembly may further include a filler to fill the gap.

In accordance with one exemplary embodiment, the key body may have a first refractive index, and the window may have a second refractive index.

In accordance with one exemplary embodiment, the second refractive index may be greater than the first refractive index.

In accordance with at least one exemplary embodiment having such configuration, a mobile terminal may be implemented to have unique patterns on its outer appearance, thereby arousing a distinguished attraction and a quality enhanced appearance.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the disclosure and are incorporated in and constitute a part of this disclosure, illustrate exemplary embodiments and together with the description serve to explain the principles of the invention. In the drawings.

DETAILED DESCRIPTION OF THE INVENTION

Figure 1:
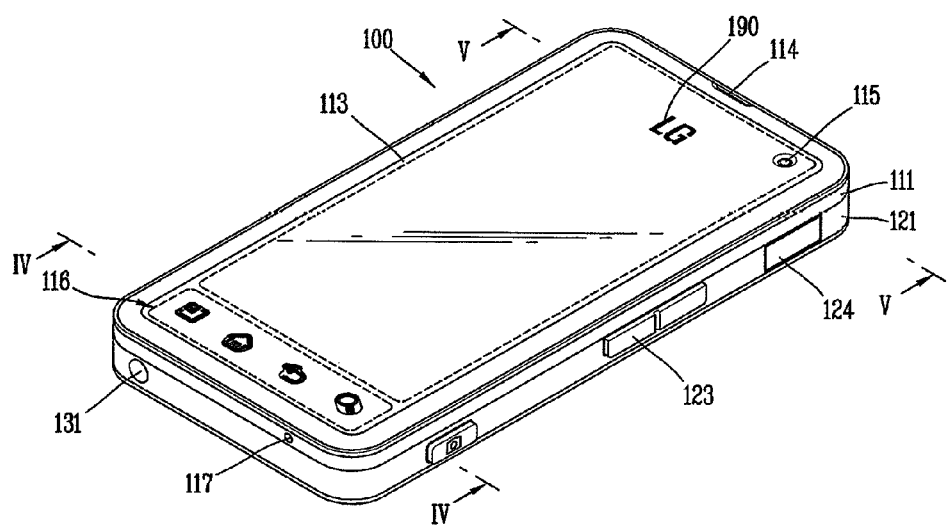
FIG. 1 is a front perspective view of a mobile terminal in accordance with one exemplary embodiment.

Description will now be given in detail of a connecting terminal unit and a mobile terminal having the same according to the exemplary embodiments, with reference to the accompanying drawings. This specification employs like/similar reference numerals for like/similar components irrespective of different embodiments, so they all will be understood by the first description. The expression in the singular form in this specification will cover the expression in the plural form unless otherwise indicated obviously from the context.

FIG. 1 is a front perspective view of a mobile terminal 100 in accordance with one exemplary embodiment.

A case (casing, housing, cover, etc.) forming an outer appearance of the mobile terminal 100 may be formed from a front case 111 and a rear case 121. A space formed by the front case 111 and the rear case 121 may accommodate various components therein. At least one intermediate case may further be disposed between the front case 111 and the rear case 121. Such cases may be formed by injection-molded synthetic resin, or may be formed using a metallic material such as stainless steel (STS) or titanium (Ti).

The front case 111 is shown having a display unit 113, a first audio output module 114, a first image input unit 115, a first manipulation unit 116, an audio input unit 117 and the like.

The display unit 113 may include a display module 141 (see FIG. 3), such as a Liquid Crystal Display (LCD) module, an Organic Light-Emitting Diode (OLED) module and the like to display visible information. The display unit 113 may be implemented as a touch screen so as to allow inputting of information by a user's touch.

The first audio output module 114 may include a receiver, a speaker or the like.

The first image input unit 115 may be a camera module for capturing images or video of the user and the like.

The first manipulation unit 116 may be manipulated to allow inputting of commands for controlling operations of the mobile terminal 100, and be a key region formed to receive a user's touch input given on a window.

The audio input unit 117 may be implemented, for example, as a type of microphone for receiving voice or other sounds input by the user.

The rear case 121 mounted to the rear surface of the mobile terminal 100 may be provided with a second manipulation unit 123, an interface 124, a power supply unit 125 and the like.

The second manipulation unit 123 may be installed at a side surface of the rear case 121. The first and manipulation units 116 and 123 may be referred to as a manipulating portion. Such manipulating portion can employ any tactile manner that a user can touch or tap for manipulation. For instance, the manipulating portion may be implemented as a dome switch, a touchpad or the like by which a user can input commands or information in a pushing or touching manner. Alternatively, the manipulating portion may be implemented as a wheel or a jog which rotates keys or a joystick.

From the functional perspective, the first manipulation unit 116 is configured to input commands such as START, END or the like, and the second manipulation unit 123 can be worked as a hot key which performs a specific function, such as activating of the first image input unit 115, as well as a scroll function. Upon employing at least the first and second manipulation units 116 and 123, inputting of telephone numbers or text messages may be executed using a touch screen disposed on the display unit 113.

The interface 124 may serve as a path for allowing data exchange between the mobile terminal and an external device. For example, the interface 124 may be at least one of wired/wireless earphone ports, ports for short-range communication (e.g., IrDA, Bluetooth, WLAN, etc.), power supply terminals for power supply to the mobile terminal and the like. The interface 124 may be a card socket for coupling to external cards, such as a Subscriber Identity Module (SIM), a User Identity Module (UIM), a memory card for storage of information and the like.

A power supply unit 125 may be provided at the rear case 121 to supply power to at least one component of the mobile terminal 100. The power supply unit 125, for example, may include a rechargeable battery for power supply. The battery may be detachably coupled for charging or the like.

Figure 2:
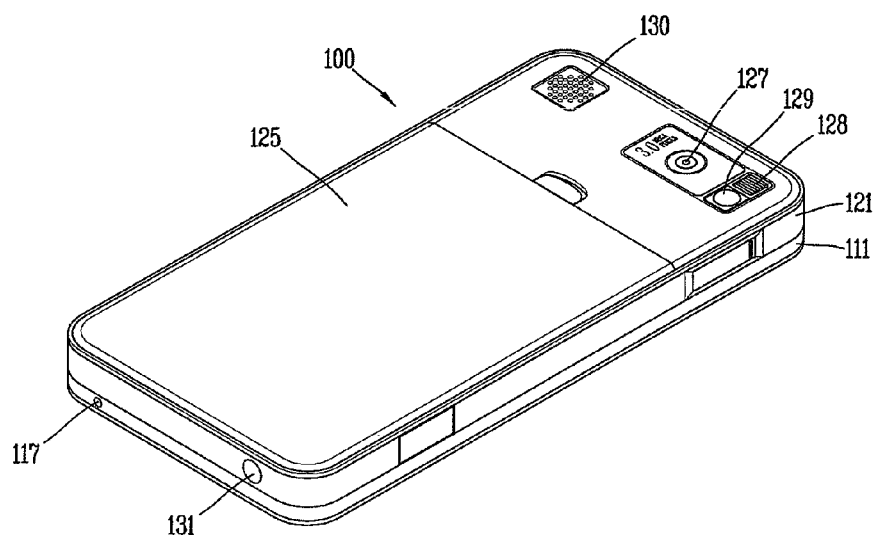
FIG. 2 is a rear perspective view of the mobile terminal.

FIG. 2 is a rear perspective view of the mobile terminal 100 of FIG. 1.

As shown in FIG. 2, the rear case 121 is shown having a second image input unit 127, a second audio output module 130, a broadcast signal receiving antenna 131 and the like.

The second image input unit 127 faces a direction which is opposite to a direction faced by the first image input unit 115 (see FIG. 1), and may have different pixels from those of the first image input unit 115.

For example, the first image input unit 115 may operate with relatively lower pixels (lower resolution). Thus, the first image input unit 115 may be useful when a user can capture his face and send it to another party during a video call or the like. On the other hand, the second image input unit 127 may operate with relatively higher pixels (higher resolution) such that it can be useful for a user to obtain higher quality pictures for later use.

A flash 128 and a mirror 129 may additionally be disposed adjacent to the second image input unit 127. The flash 129 operates in conjunction with the second image input unit 128 when taking a picture using the second image input unit 127. The mirror 129 can cooperate with the second image input unit 127 to allow a user to photograph himself in a self-portrait mode.

The second audio output module 130 can cooperate with the first audio output module 114 (see FIG. 1) to provide stereo output. Also, the audio output module 130 may be configured to operate as a speakerphone.

A broadcast signal receiving antenna 131 may be disposed at one side of the rear case 121 in addition to an antenna for communications. The antenna 131 may be drawn out of the rear case 121.

As described above, it has been described that the first manipulation unit 116 or the like is disposed at the front case 111 and the second manipulation unit 123 or the like is disposed at the rear case 121; however, the present disclosure may not be limited to the configuration. For example, the second manipulation unit 123 may be disposed at the front case 111 in the vicinity of the first manipulation unit 116. In addition, without the second image input unit 127, the first image input unit 115 can be implemented to be rotatable so as to rotate up to a direction which the second image input unit 127 faces.

Figure 3:
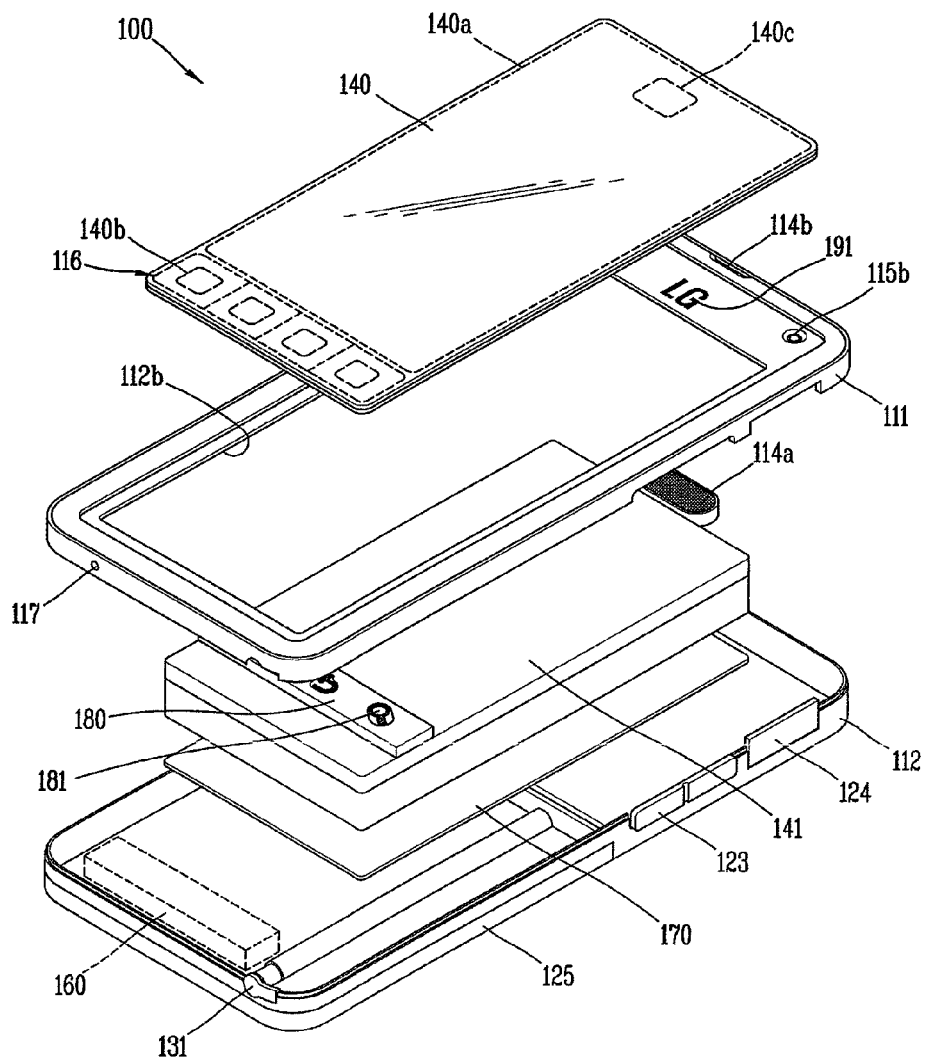
FIG. 3 is a disassembled perspective view of the mobile terminal.

FIG. 3 is a disassembled perspective view of the mobile terminal 100.

As shown in FIG. 3, a window 140 may be coupled to cover one surface of the front case 111. The window 140 may cover the one surface of the display module 141 such that visual information output on the display module 141 can be recognized from the exterior. The display module 141 and the window 140 may implement the display unit 113 (see FIG. 1).

The window 140 may be configured to be sensitive to user's touch inputs, and allowed for inputting of information (commands, signals, etc.).

The window 140 may have an area corresponding to the display module 141, and be made of a transparent material. The window 140 may have an opaque region having no transparency or very low transparency. For example, a surface processing may be executed for the edges of the window 140 such that light cannot be transmitted therethrough.

The window 140 may generally be formed of a transparent or semi-transparent material. For example, if partial regions 140b, 140c of the window 140 are formed of the semi-transparent, the other regions of the window 140 are formed of the transparent material, or vice versa. Accordingly, key bodies 181 or a pattern portion located beneath low surfaces of the first regions 140b and a lower surface of the second region 140c may achieve a three-dimensional effect or improved visibility, and acquire distinguished beauty. As one example, the window 140 adjacent to a bezel and a key region occupied by the first manipulation unit 116 may be formed opaque or semi-transparent, while the first region 140b may be formed transparent so as to allow for visible recognition of the key body 181 formed beneath the first region 140b, thereby providing user convenience and unique attraction of the terminal.

A manipulation pad corresponding to the first manipulation unit 116 may be formed at the front case 111. The manipulation pad may be subject to user's touching or pressing. The manipulation pad may be formed as a manipulation region on a part of the window 140.

The front case 111 may further include a sound hole 114b, a window hole 112b and an image window.

The sound hole 114b may be formed in alignment with the audio output module 114 (see FIG. 1) to allow for outputting of sounds, for example, ring tone, music and the like, to the outside of the mobile terminal.

The window hole 112b may be formed in alignment with the display unit 113. A transparent (light-transmittable) window may also be located on a camera module 115b formed in alignment with the first image input unit 115 (see FIG. 1).

The rear case 112 may include a circuit board 170, a display module 141, a speaker module 114a, a camera module, a switch and the like.

The circuit board 170 may be configured as one example of a controller for controlling various functions of the mobile terminal 100. The circuit board 170 may detect electrical changes, for example, changes in capacitance or the quantity of electric charges, which occur within the window 140 as a user touches the window 140. An electrode may be located inside the window 140. The electrode may be a conductive pattern. The electrode may be charged with charges. As a conductive body moves within a close distance, the quantity of electric charges may change. When a conductive body, for example, a finger touches a window, the quantity of charges charged in the electrode may change, which can be understood that the capacitance between the finger and the electrode changes.

The electrode of the window 140 may be electrically connected to a controller, for example, the circuit board 170 for detecting the changes in the quantity of charges. For the electric connection, a flexible circuit board may be connected to the circuit board 170 through a hole (not shown). With the change in the quantity of charges detected, the circuit board 170 may change a state of at least one of functions related to the mobile terminal 100.

FIGS. 4A to 4D are sectional views taken along the line IV-IV of FIG. 1.

Figure 5:
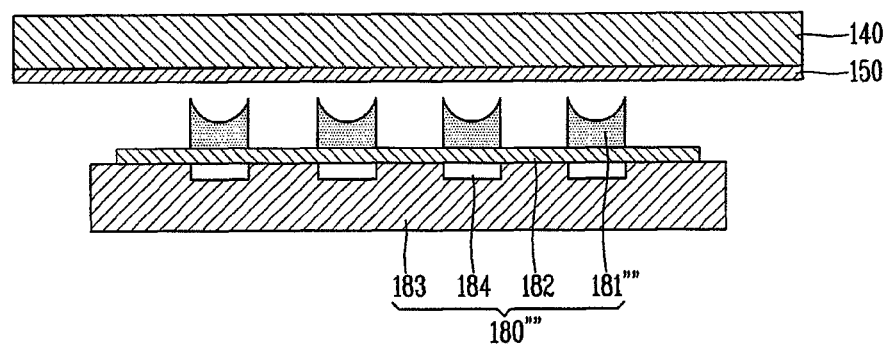
FIG. 5 is a sectional view taken along the line IV-IV of FIG. 1 in relation to an exemplary variation.

FIG. 5 is a sectional view taken along the line IV-IV of FIG. 1 in relation to an exemplary variation.

As shown in FIGS. 4A to 4D and FIG. 5, the first manipulation unit 116 (see FIG. 1) is formed on one surface of the window 140 (hereinafter, the first manipulation unit 116 is referred to as a key region for reception of touch inputs). When the key region 116 is touched, the touched region may be detected and a preset signal with respect to the touch-detected region may be transferred to a controller so as to allow a specific function of the terminal to be performed.

Figure 4A:
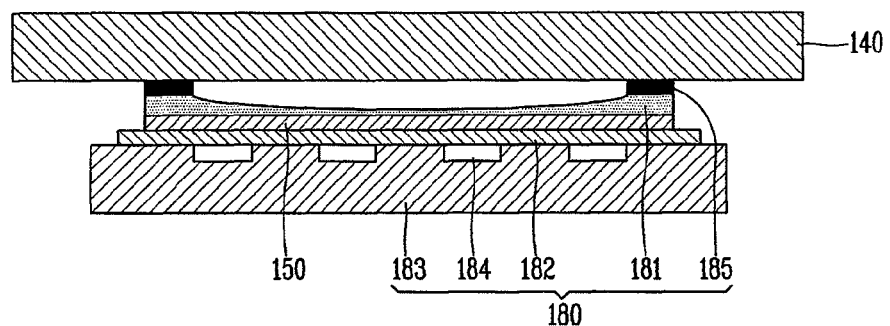
FIGS. 4A to 4D are sectional views taken along the line IV-IV of FIG. 1.
Figure 4B:
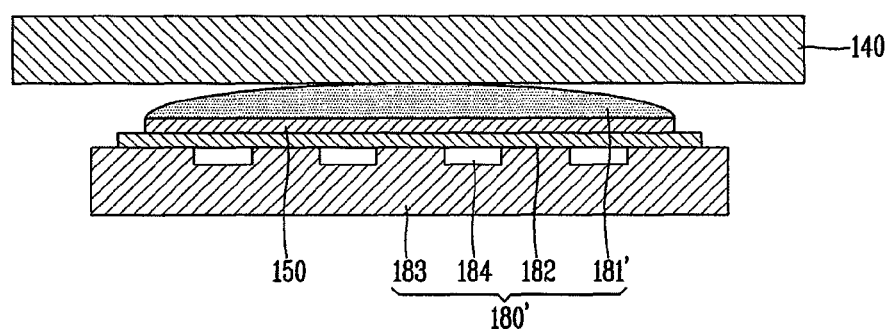
Figure 4C:
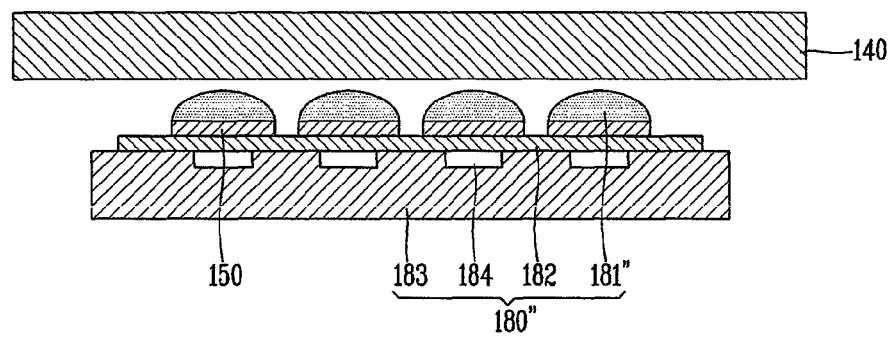
Figure 4D:
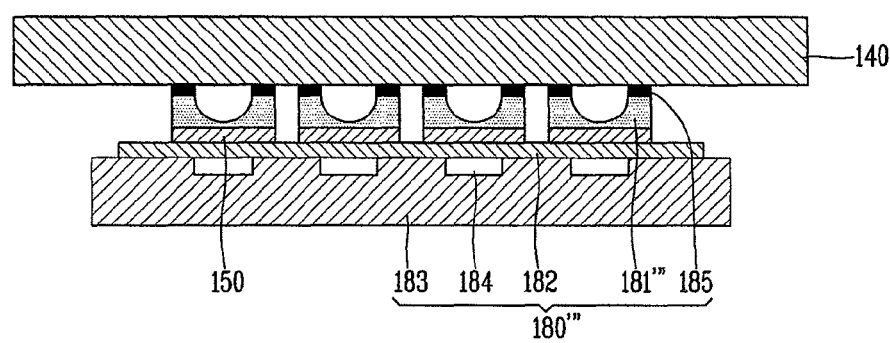

A key body assembly 180, 180', 180", 180''', 180'''' may be formed beneath the window 140. That is, the window 140 and the key region 116 may be stacked on the key body assembly 180, 180', 180", 180''', 180''''. As shown in FIGS. 4A and 4B, the key body assembly 180, 180', 180", 180''' may include a key body 181, 181', 181", 181''' overall having a concave or convex shape. Also, as shown in FIGS. 4C and 4D, the key body 181, 181', 181", 181''' may be divided into plurality.

When the key body overall has the concave or convex shape, the thickness of the key body 181 continuously changes from one end to the other, accordingly, light transmitted from the lower end to the upper end of the key body assembly 180 may be diffused or refracted, thereby giving the key body assembly 180 a unique three-dimensional effect. Alternatively, the key body 181 may be formed to have a portion with a different refractive index from other portions. Accordingly, a light path may differ at each portion due to the difference of thickness or refractive index, so the key body assembly 180 may obtain a unique three-dimensional effect.

As aforementioned, the key body 181 may be divided into plurality, and each divided key body 181 may have a different pattern related to a function of the terminal. The pattern is a type of key mark. Each pattern, as shown in FIGS. 1 to 3, may have a specific shape, such as square, house, arrow indicating the rear, magnifying glass or the like, so as to be associated with a function of the terminal, like menu, home, rewind, search or the like.

Hence, users can guess, viewing those key marks, that they can execute a desired function of the terminal by pressing or touching the corresponding key region 116. That is, the key region 116 is provided with key marks having different patterns, and predetermined functions of the terminal are executed when a user touches a region where those key marks are disposed.

The key body 181 may be made of a transparent or semi-transparent material. Also, the key body 181 may be formed by UV molding, silicon molding, or made of epoxy resin.

The key body 181 may be laminated (stacked) on a light guide film 182. The light guide film 182 may serve as a path of light emitted from lower electric diodes 184. Thus, when a user touches the key region 116, the touch input is detected. Light is then emitted from the electric diode 184 with respect to the touch-detected region. Accordingly, a part of the touch region may be radiated.

The electric diode 184 may be a light emitting diode (LED) having high efficiency in power consumption. A lower layer 183 of the light guide film 182 may be a circuit board or a display module.

A key mark printed layer 150 having different patterns related to functions of the terminal may be located between the key body 181'''' and the light guide film 182. The key mark printed layer 150, as shown in FIG. 5, may alternatively be formed on the window 140. As aforementioned, each of key marks disposed on the key mark printed layer 150 may have a specific shape, such as square, house, arrow indicating the rear, magnifying glass or the like, so as to be associated with a function of the terminal, like menu, home, rewind, search or the like. Hence, users can guess, viewing those key marks, that they can execute a desired function of the terminal by pressing or touching the corresponding key region 116. To correspond to the plurality of key marks, the key region 116 may be divided into plurality. When the electric diode 184 located beneath the key region 116 emits light in response to a touch input on a key mark, a user can easily recognize the corresponding key mark by virtue of the light. The plurality of key regions 116 may be radiated by the lower electric diodes 184 and controlled to operate independent of one another.

Consequently, users can manipulate their terminals more reliably. The divided key regions 116 are visible with different brightness or different color of light, thereby providing user convenience in use and distinguished attraction to the terminal.

The key bodies may have an improved three-dimensional effect by making the key body 181 and the window 140 laminated on the key body 181 have different refractive indexes. In general, a refractive index of a glass substrate increases if the glass substrate contains $Nb_2O_5$, BaO and $TiO_2$. Especially, upon containing 40-50% by weight of $Nb_2O_5$, 17-26% by weight of BaO and 1-6% by weight of TiO$_2$, the glass substrate has a refractive index over 1.8. On the contrary, the refractive index of the key body 181 is typically less than 1.5. Thus, if the refractive index of the window 140 may be set higher than that of the key body 181, visibilities of the key marks can be improved and the three-dimensional effect of the key body 181 can be further enhanced.

As shown in FIGS. 4A and 4D, the key body 181 and the window 140 may be formed to be partially spaced from each other by a predetermined gap. A filler 185 for filling the gap may be disposed so as to elastically support the window 140 when the window 140 is pressed and prevent moisture permeation into the gap.

Also, the key body 181 and the window 140 corresponding to the key region 116 below which the key body 181 is laminated may be configured to partially have different colors. The key body 181 and the window 140 may be formed with different colors alternately or sequentially present in a thickness direction or a width direction. As one example, a part of one surface of the key body may be recessed and provided with a dark or light blue color and a portion wrapping the recessed part may be provided with a light or dark blue color, thereby giving a three-dimensional effect to the recessed part.

Unlike to this, the key body or the window may be formed with a plurality of colors, which consecutively change in the thickness direction or the width direction, or create a gradation effect showing a gradually darkening or lightening change. Hence, the key body 181 can exhibit more improved three-dimensional effect and visibility.

In addition to the changes in colors, as aforementioned, the first region 140b may be formed to have a different refractive index or transparency from the adjacent window. Accordingly, the key body 181 formed beneath the first region 140b may appear larger or smaller. Also, the edges of the window in the vicinity of a bezel may be formed opaque or semi-transparent, and only the first region 140b may be formed transparent, thereby improving visibility of the key body 181 formed beneath the first region 140b or enhancing the three-dimensional effect of a recess member or protrusion member of the key body 181.

Figure 6:
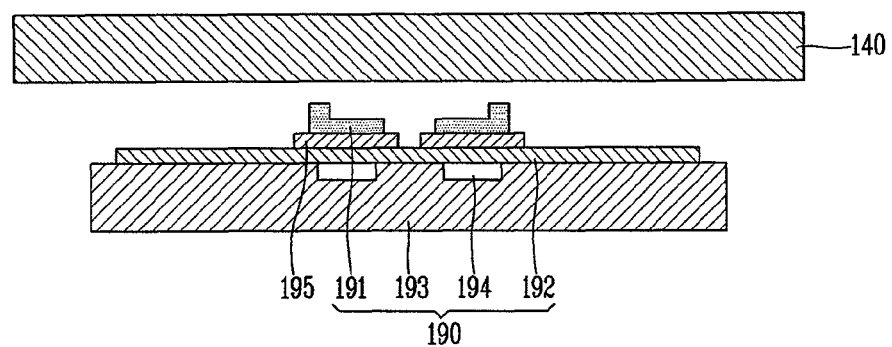
FIG. 6 is a sectional view taken along the line V-V of FIG. 1.

FIG. 6 is a sectional view taken along the line V-V of FIG. 1.

The logo unit 190 may be located between the window 140 and the terminal body, and formed by laminating a pattern portion 191 and the like. The aforementioned key mark corresponds to the pattern portion 191, and may include one of character, number, symbol or a pattern defining a logo.

Referring to FIG. 6, the pattern portion 191 may have a portion protruded or recessed as compared with other portions. Also, the pattern portion 191 may overall have concave or convex shape. Here, the thickness of the pattern portion 191 continuously changes from one end to the other, accordingly, light transmitted from the lower end to the upper end of the pattern portion 191 may be diffused or refracted, thereby giving the pattern portion 191 a unique three-dimensional effect. Alternatively, the pattern portion 191 may be formed to have a portion with a different refractive index from other portions. Accordingly, a light path may differ at each portion due to the difference of thickness or refractive index, so the pattern portion 191 may have a unique three-dimensional effect.

The pattern portion 191 may be made of a transparent or semi-transparent material. Also, the pattern portion 191 may be formed by UV molding, silicon molding, or made of epoxy resin.

The pattern portion 191 may be stacked on the light guide film 192. The light guide film 192 may serve as a path of light emitted from a lower electric diode 194. Thus, in a power-on/off state of the terminal or during a call connection, when the electric diode 194 emits light, at least a part of the pattern portion 191 can be radiated.

The electric diode 194 may be a light emitting diode (LED) having high efficiency in power consumption. A lower layer 193 of the light guide film 192 may be a circuit board or a display module.

A printed layer 195, which includes one of character, number, symbol or a pattern defining a logo, may be located between the pattern portion 191 and the light guide film 192. The printed layer 195 may alternatively be formed on the window 140 similar to the arrangement of the printed layer 150 as shown in FIG. 5.

The pattern portion 191 may be divided into plurality, and each divided pattern portion 191 may include one of character, number, symbol or a pattern defining a logo.

As aforementioned, the light guide film 192, the pattern portion 191 and the window 140 may have different refractive indexes or at least two of them may have different refractive indexes, thereby improving visibility of the pattern portion 191 and further enhancing the three-dimensional effect of the pattern portion 191.

Also, the pattern portion 191 and the window 140 may be formed to be partially spaced from each other by a predetermined gap. A filler may be disposed to fill the gap so as to elastically support the window 140 when the window 140 is pressed and prevent moisture permeation into the gap.

Also, the pattern portion 191 and the window 140 below which the pattern portion 191 is laminated may be configured to partially have different colors. The pattern portion 191 and the window 140 may be formed with different colors, which are present alternately or sequentially in a thickness direction or a width direction. As one example, a part of one surface of the pattern portion may be recessed and provided with a dark or light blue color and a portion wrapping the recessed part may be provided with a light or dark blue color, thereby giving a three-dimensional effect to the recessed part.

Unlike to this, the pattern portion 191 or the window 140 may be formed with a plurality of colors, which consecutively change in the thickness direction or the width direction, or create a gradation effect showing a gradually darkening or lightening change. Hence, the key body 181 can exhibit more improved three-dimensional effect and visibility.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
   a window having conductive patterns configured to be sensitive to a user's touch inputs, at least one of the conductive patterns being located in a key region of the window and including an electrode located inside the window; and
   a key body assembly disposed beneath the window, the key body assembly including:
   a light guide film;
   at least one key body having a first surface and a second surface, the first surface having a predetermined curvature by a recess portion or a protrusion portion, portion facing the key region of the window, and the second surface being coupled to the light guide film;
   a key mark printed layer located between the at least one key body and the light guide film; and
   electric diodes provided beneath the light guide film opposite a surface of the light guide film having the at least one key body, each electric diode emitting light to at least part of the key region in response to a user's touch input,
   wherein the thickness of the key body continuously changes from one end to the other such that light transmitted from the lower end to the upper end of the key body assembly is diffused or refracted,
   wherein at least a part of the at least one key body is made of a transparent or semi-transparent material,
   wherein a refractive index of the window is greater than a refractive index of the key body, and
   wherein a bottom surface of the window is flat, and the first surface of at least one key body and the bottom surface of the window are spaced apart from each other by the predetermined curvature of the key body.

2. The terminal of claim 1, wherein the at least one key body is divided into a plurality of key bodies, and each of the key bodies comprises a different pattern related to functions of the terminal.

3. The terminal of claim 1,
   wherein the key body assembly includes a filler located in the gap and contacting both the at least one key body and the window.

4. The terminal of claim 1, wherein at least a part of the window is made of a transparent or semi-transparent material.

5. The terminal of claim 1, wherein at least a part of the window has a first color and at least a part of the at least one key body has a second color.

6. The terminal of claim 5, wherein the second color of the at least one key body includes alternating colors in a thickness or width direction of the at least one key body.

7. The terminal of claim 5, wherein the second color of the at least one key body includes a plurality of colors consecutively changing in a thickness or width direction of the key body.

8. The terminal of claim 1, wherein the at least one key body is located between the light guide film and the window.

* * * * *